(12) United States Patent
Hanson et al.

(10) Patent No.: US 8,026,581 B2
(45) Date of Patent: Sep. 27, 2011

(54) GALLIUM NITRIDE MATERIAL DEVICES INCLUDING DIAMOND REGIONS AND METHODS ASSOCIATED WITH THE SAME

(75) Inventors: Allen W. Hanson, Cary, NC (US); Edwin Lanier Piner, Cary, NC (US)

(73) Assignee: International Rectifier Corporation, El Segundo, CA (US)

( * ) Notice: Subject to any disclaimer, the term of this patent is extended or adjusted under 35 U.S.C. 154(b) by 390 days.

(21) Appl. No.: 12/025,976

(22) Filed: Feb. 5, 2008

(65) Prior Publication Data

US 2009/0194773 A1 Aug. 6, 2009

(51) Int. Cl.
*H01L 23/495* (2006.01)
*H01L 29/66* (2006.01)

(52) U.S. Cl. .......... 257/675; 257/77; 257/192; 257/194; 257/201; 257/E29.246; 257/E29.248; 257/E29.249

(58) Field of Classification Search .................. 257/77, 257/192, 194, 201, 675, E29.246, E29.248, 257/E29.249

See application file for complete search history.

(56) References Cited

U.S. PATENT DOCUMENTS

| | | | |
|---|---|---|---|
| 4,843,440 A | 6/1989 | Huang | |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |
| 5,739,554 A | 4/1998 | Edmond et al. | |
| 5,741,724 A | 4/1998 | Ramandi et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |
| 5,838,706 A | 11/1998 | Edmond et al. | |
| 5,874,747 A | 2/1999 | Redwing et al. | |
| 5,929,467 A | 7/1999 | Kawai et al. | |
| 6,051,849 A | 4/2000 | Davis et al. | |
| 6,064,078 A | 5/2000 | Northrup et al. | |
| 6,064,082 A | 5/2000 | Kawai et al. | |
| 6,069,021 A | 5/2000 | Terashima et al. | |
| 6,100,545 A | 8/2000 | Chiyo et al. | |
| 6,120,600 A | 9/2000 | Edmond et al. | |
| 6,121,121 A | 9/2000 | Koide | |
| 6,139,628 A | 10/2000 | Yuri et al. | |
| 6,146,457 A | 11/2000 | Solomon | |
| 6,153,010 A | 11/2000 | Kiyoku et al. | |
| 6,156,581 A | 12/2000 | Vaudo et al. | |
| 6,177,688 B1 | 1/2001 | Linthicum et al. | |
| 6,180,270 B1 | 1/2001 | Cole et al. | |
| 6,201,262 B1 | 3/2001 | Edmond et al. | |
| 6,255,198 B1 | 7/2001 | Linthicum et al. | |
| 6,261,929 B1 | 7/2001 | Gehrke et al. | |
| 6,261,931 B1 | 7/2001 | Keller et al. | |

(Continued)

*Primary Examiner* — Long Tran
(74) *Attorney, Agent, or Firm* — Farjami & Farjami LLP

(57) ABSTRACT

Gallium nitride material structures are provided, as well as devices and methods associated with such structures. The structures include a diamond region which may facilitate conduction and removal of heat generated within the gallium nitride material during device operation. The structures described herein may form the basis of a number of semiconductor devices and, in particular, transistors (e.g., FETs).

3 Claims, 7 Drawing Sheets

U.S. PATENT DOCUMENTS

| | | |
|---|---|---|
| 6,265,289 B1 | 7/2001 | Zheleva et al. |
| 6,291,319 B1 | 9/2001 | Yu et al. |
| 6,329,063 B2 | 12/2001 | Lo et al. |
| 6,380,108 B1 | 4/2002 | Linthicum et al. |
| 6,391,748 B1 | 5/2002 | Temkin et al. |
| 6,403,451 B1 | 6/2002 | Linthicum et al. |
| 6,420,197 B1 | 7/2002 | Ishida et al. |
| 6,426,512 B1 | 7/2002 | Ito et al. |
| 6,440,823 B1 | 8/2002 | Vaudo et al. |
| 6,441,393 B2 | 8/2002 | Goetz et al. |
| 6,459,712 B2 | 10/2002 | Tanaka et al. |
| 6,465,814 B2 | 10/2002 | Kasahara et al. |
| 6,486,502 B1 | 11/2002 | Sheppard et al. |
| 6,498,111 B1 | 12/2002 | Kapolnek et al. |
| 6,521,514 B1 | 2/2003 | Gehrke et al. |
| 6,524,932 B1 | 2/2003 | Zhang et al. |
| 6,548,333 B2 | 4/2003 | Smith |
| 6,583,034 B2 | 6/2003 | Ramdani et al. |
| 6,583,454 B2 | 6/2003 | Sheppard et al. |
| 6,586,781 B2 | 7/2003 | Wu et al. |
| 6,610,144 B2 | 8/2003 | Mishra et al. |
| 6,611,002 B2 | 8/2003 | Weeks et al. |
| 6,617,060 B2 | 9/2003 | Weeks et al. |
| 6,624,452 B2 | 9/2003 | Yu et al. |
| 6,649,287 B2 | 11/2003 | Weeks, Jr. et al. |
| 6,765,240 B2 | 7/2004 | Tischler et al. |
| 6,765,241 B2 | 7/2004 | Ohno et al. |
| 6,777,278 B2 | 8/2004 | Smith |
| 6,841,409 B2 | 1/2005 | Onishi |
| 6,849,882 B2 | 2/2005 | Chavarkar et al. |
| 7,071,498 B2 | 7/2006 | Johnson et al. |
| 7,135,720 B2 | 11/2006 | Nagy et al. |
| 7,161,194 B2 | 1/2007 | Parikh et al. |
| 7,233,028 B2 | 6/2007 | Weeks et al. |
| 7,247,889 B2 | 7/2007 | Hanson et al. |
| 7,352,016 B2 | 4/2008 | Nagy et al. |
| 2001/0042503 A1 | 11/2001 | Lo et al. |
| 2002/0020341 A1 | 2/2002 | Marchand et al. |
| 2002/0117695 A1 | 8/2002 | Borges |
| 2003/0136333 A1 | 7/2003 | Semond et al. |
| 2005/0067716 A1* | 3/2005 | Mishra et al. .............. 257/778 |
| 2005/0145851 A1 | 7/2005 | Johnson et al. |
| 2005/0167775 A1 | 8/2005 | Nagy et al. |
| 2005/0285141 A1 | 12/2005 | Piner et al. |
| 2005/0285142 A1 | 12/2005 | Piner et al. |
| 2006/0006500 A1 | 1/2006 | Piner et al. |
| 2008/0179631 A1* | 7/2008 | Kinzer ..................... 257/194 |

* cited by examiner

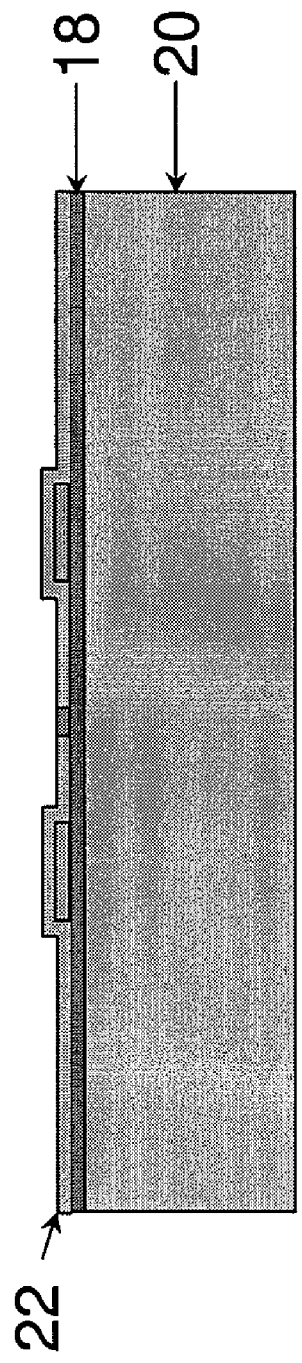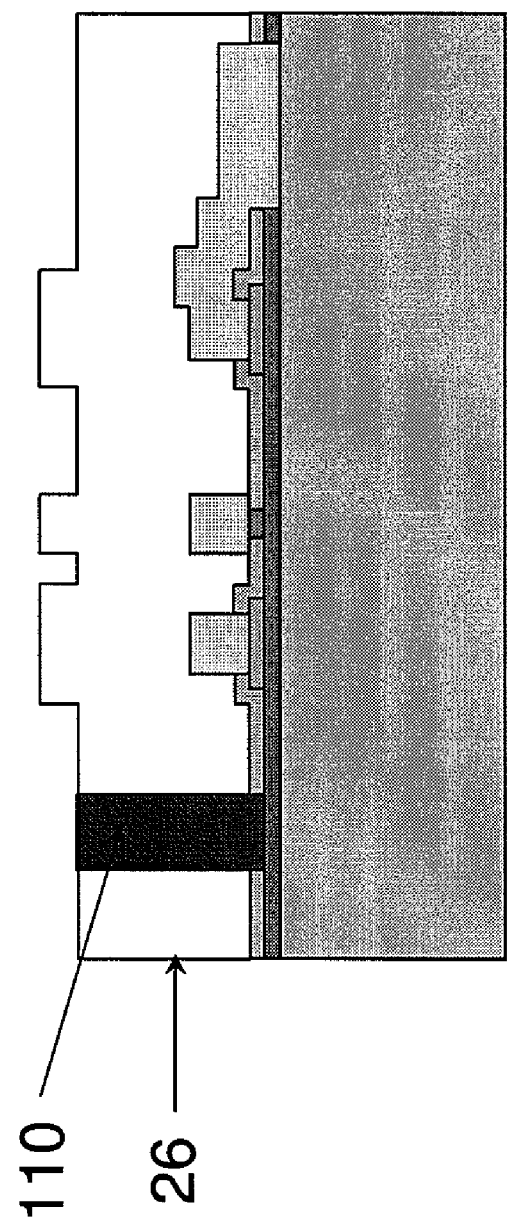

GALLIUM NITRIDE MATERIAL DEVICES INCLUDING DIAMOND REGIONS AND METHODS ASSOCIATED WITH THE SAME

FIELD OF INVENTION

The invention relates generally to gallium nitride material devices and, more particularly, to gallium nitride material devices including diamond regions, as well as devices and methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many microelectronic applications such as transistors, field emitters, and optoelectronic devices.

Despite the attractive properties noted above, a number of challenges exist in connection with developing gallium nitride material devices. For example, gallium nitride material devices can generate significant amounts of heat during use which can have adverse effects on the performance of devices. For instance, increased device temperature can result in lower carrier mobility, lower sheet charge density, lower effective saturation velocity, and higher leakage currents, effectively limiting the ability of the device to produce RF power. Accordingly, it can be advantageous to remove heat efficiently from a device to keep device temperatures below a desired limit.

SUMMARY OF INVENTION

Gallium nitride material structures are provided, as well as devices and methods associated with such structures.

In one aspect, a gallium nitride material device structure is provided. The device structure comprises a gallium nitride material region and an electrical contact associated with the gallium nitride material region. A diamond region is formed on the electrical contact.

In another aspect, a gallium nitride material device structure is provided. The device structure comprises a gallium nitride material region and a nucleation layer formed over the gallium nitride material region. The nucleation layer has a window defined therein exposing a portion of the gallium nitride material region. The device structure further comprises a diamond region formed on the nucleation layer. The gallium nitride material region in the window is substantially free of diamond being formed thereon.

In another aspect, a gallium nitride material device structure is provided. The device structure comprises a gallium nitride material region and an electrical contact associated with the gallium nitride material region. The device further comprises a heat sink and a diamond region is arranged to conduct heat generated within the gallium nitride material region to the heat sink. An electrically conductive pathway extends through the thickness of the gallium nitride material region.

In another aspect, a method of forming gallium nitride material device structure is provided. The method comprises forming an electrical contact on a gallium nitride material region and forming a diamond region formed on the electrical contact.

In another aspect, a method of forming gallium nitride material device structure is provided. The method comprises forming a nucleation layer over a gallium nitride material region. The nucleation region having a window defined therein to expose a portion of the gallium nitride material region. The method further comprises forming a diamond region on the nucleation layer. The gallium nitride material region in the window is substantially free of diamond being formed thereon.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF DRAWINGS

FIGS. 3A-E illustrate a method of fabricating a packaged gallium nitride material-based device structure according to an embodiment of the present invention.

DETAILED DESCRIPTION

The present invention relates to semiconductor device structures comprising a gallium nitride material region and methods associated with such structures. The device structures include a diamond region which may facilitate conduction and removal of heat generated within the gallium nitride material during device operation. In some embodiments, the diamond region is formed on one or more electrical contacts (e.g., source, gate, drain electrodes) associated with the gallium nitride material region. The diamond region may isolate the electrical contact(s) from other electrically conductive materials, while efficiently transporting heat away from the gallium nitride material region. The structures described herein may form the basis of a number of semiconductor devices and, in particular, transistors (e.g., FETs).

Figure 1:
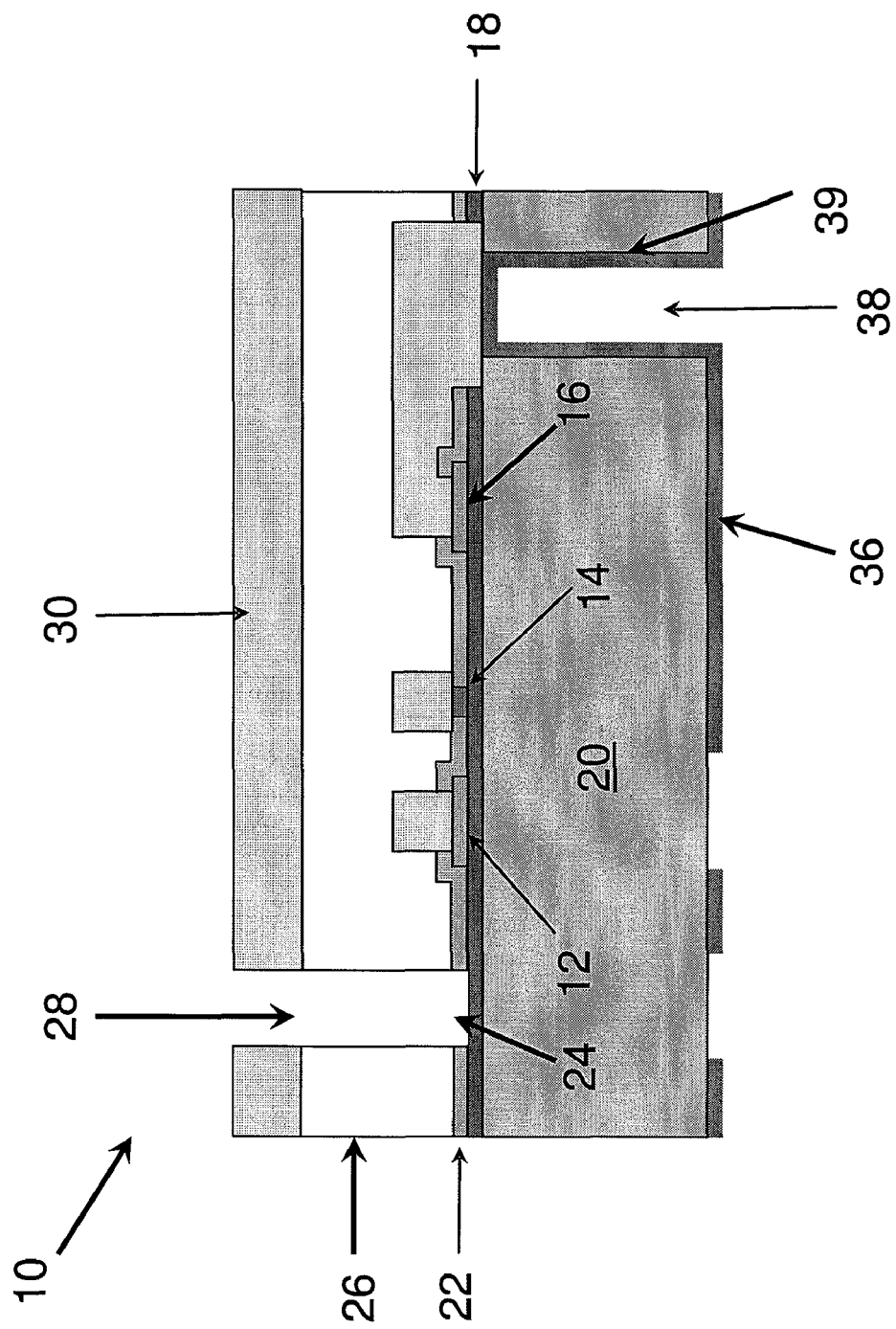
FIG. 1 illustrates a gallium nitride material device structure according to an embodiment of the present invention.
Figure 1A:
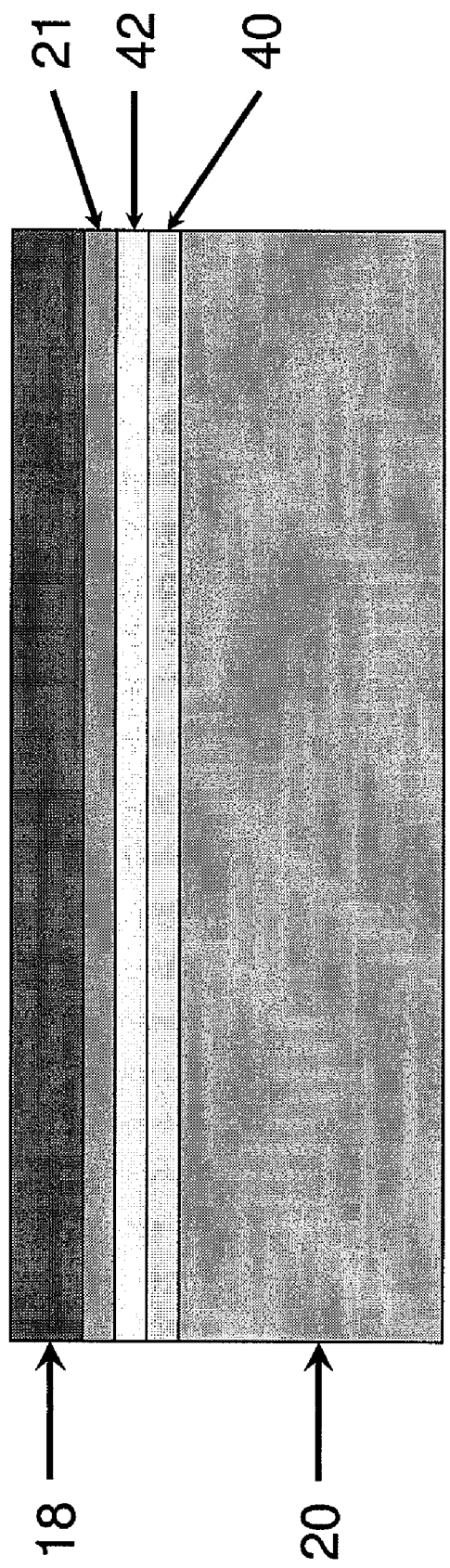
FIG. 1A illustrates a portion of the device structure of FIG. 1.

FIG. 1 illustrates a gallium nitride material device structure 10 according to one embodiment of the invention. In the illustrative embodiment, the device structure is a field effect transistor (FET) that includes a source electrode 12, a drain electrode 16, and a gate electrode 14 formed on a gallium nitride material region 18. The gallium nitride material region is formed on a substrate 20 (e.g., silicon). As shown in FIG. 1A, a series of layers (e.g., a transition layer 21, a strain-absorbing layer 40, an intermediate layer 42) may be formed between the substrate and the gallium nitride material region as described further below. In this embodiment, a nucleation layer 22 is formed over the gallium nitride material region. The nucleation layer is patterned such that window region 24 on the gallium nitride material region is exposed, as described further below. A diamond region 26 is deposited over the nucleation layer and does not adhere to the window region 24, leaving a channel region (e.g., "saw street") 28 that allows for efficient wafer dicing. As described above, the diamond region promotes heat transfer from the transistor while maintaining electrical insulation. A thermally conductive layer 30 can be deposited over the diamond region. Metallization is also deposited on the backside of the wafer to produce interconnects (not shown) and bond pads 36. In this embodiment, a via 38 extends from the backside and allows electrical access to the contact pads through the thickness of the substrate and gallium nitride material region when a metal layer 39 is deposited in the via.

It should be understood that not all of the features (e.g., layers) shown in FIG. 1 are present in all embodiments of the invention and that the illustrated features may be otherwise positioned within the structure. Also, additional features may be present in other embodiments. Additional features are shown in the other figures and/or described further below.

When a layer is referred to as being "on", "over" or "overlying" another feature (e.g., layer or substrate), it can be directly on the feature, or an intervening layer also may be present. A layer that is "directly on" another layer or substrate means that no intervening layer is present. It should also be understood that when a layer is referred to as being "on", "over" or "overlying" another feature (e.g., layer or substrate), it may cover the entire feature, or a portion of the feature.

Diamond in region 26 is an allotrope of carbon, which is a tetrahedrally bonded arrangement of carbon atoms of the diamond cubic lattice structure. It should be understood that diamond region 26 may comprise other components other than diamond. For example, diamond region 26 may include diamond particles dispersed in another material such as an epoxy. In some embodiments, region 26 is formed primarily (>50% by weight) of diamond; in some embodiments, the region consists essentially of diamond (i.e., the region does not include any other components that materially affect the properties of the region); and, in some embodiments, the region consists of diamond (i.e., the region does not include any other components other than diamond).

Diamond region 26 is formed on the source, gate and drain electrodes. Though it should be understood that in some embodiments, the diamond region may be otherwise positioned in the device structure and may not be formed on the contacts. As shown, the diamond region is formed directly on the source, gate and drain electrodes. In this embodiment, the diamond region also at least partially surrounds each of the electrodes. For example, the diamond region surrounds at least a portion of the sides (or, all of the sides) of the electrodes, as shown in the embodiment of FIG. 1. It should be understood that other embodiments may include variations to the structure shown in FIG. 1 such as that the diamond region may extend completely around sides of only one of the electrodes, but may not surround (or, may only partially surround) sides of the other electrodes, and the like.

Diamond region 26 may have any suitable thickness. Suitable thicknesses include between 2.5 micron and 125 micron; and, in some cases, between 25 micron and 75 micron. In the illustrative embodiment, the diamond region has a thickness to sufficiently surround each of the electrodes.

During operation, the high thermal conductivity of the diamond region allows for the efficient transfer of heat from the gallium nitride material device to, for example, an external component such as a heat sink, as described further below. In addition, the electrodes are effectively insulated from each other and other electrically conductive materials due to the low electrical conductivity of the diamond material region.

As noted above, a channel region 28 may extend through diamond region 26 to facilitate processing and, in particular, dicing of the device structure to form individual devices. The channel region is formed since the diamond region does not readily deposit on the underlying gallium nitride material region. The channel region can provide a pathway along which the device structure can be diced without having to cut through the ultra-hard diamond region. When used to facilitate dicing, the channel region is present in a precursor device structure (i.e., a device structure that has not been completely processed) but is not present in the final device structure, after dicing. When used to facilitate dicing, the channel region may extend across the entire device structure and also semiconductor wafer. The channel region may have any suitable dimensions including a width of between 10 micron and 150 micron, or between 25 micron and 100 micron.

Nucleation layer 22 is formed between the substrate and the diamond region in the illustrative embodiment. The nucleation layer may have any suitable thickness. In some embodiments, the thickness of the nucleation layer is between 1 nm and 1,000 nm; while, in other embodiments it is between 50 nm and 1,000 nm.

The nucleation layer may have any suitable composition which enables formation of the diamond region thereon. Suitable compositions include silicon nitride-based materials such as non-stoichiometric silicon nitride ($SiN_x$). It should be understood that other compositions may also be suitable. The nucleation layer can be patterned such that windows on the gallium nitride material region are exposed. When a diamond region is deposited over the nucleation layer, the exposed gallium nitride material regions may be left substantially free of diamond. Silicon nitride-based nucleating layers may be particularly effective at preventing diamond from nucleating within the windows. The windows may have any suitable shape and, as noted above, may provide channel regions in the overlying diamond region which facilitate for efficient wafer dicing. In other embodiments, the windows may not be shaped to provide channels, but may form other shapes and, in some cases, may be used for other purposes other than to facilitate wafer dicing.

The device structure of FIG. 1 includes a via 38. The via may have any suitable dimensions and shape. The cross-sectional profile of the via may be square, rectangular, spherical, triangular, or the like. The via may have the same cross-sectional profile throughout the via, or may have a cross-sectional area which changes (e.g., increases, decreases) at any point along the depths of the via.

As shown, the via extends from a backside of the device structure through the bulk of the substrate and the gallium nitride material region to the topside of the structure. The via may extend from different sides of the structure and to a variety of depths in the structure based on the application. In some cases, the via extends through the entire structure (e.g., as shown in FIG. 1) and, thus, from both the topside and backside. However, it is also possible for the via to extend from only one of the topside or backside and through only a portion of the structure. For example, the via may extend from the topside to the silicon substrate (particularly, if the silicon substrate is sufficiently conductive and may be grounded).

Also, the via may extend from the backside through the silicon substrate to a point within the gallium nitride material region.

Other via arrangements are also possible. It should be understood that not all embodiments include such a via, and in some embodiments, the via may have different dimensions and/or location. The device structure may include more than one via.

In the illustrative embodiment, metal layer 39 is formed in the via and provides an electrically conductive pathway from interconnects and bond pads 36 at the backside of the device to the source, gate and drain electrodes. The metal layer may have any suitable thickness.

The metal components (e.g., electrodes, bond pads, interconnects and metal layer within the via) may have any suitable metal composition including metal alloy compositions. Suitable metals alloy compositions may comprise, for example, one or more of titanium, nickel, aluminum, gold and copper. In some embodiments, the metal used to form at least one of the components (e.g., gate electrode) may be a refractory metal. Refractory metals are particularly well suited for high processing temperatures that may be used when forming the diamond region.

In some embodiments, certain metal components may be formed in the same processing step. In these embodiments, the metal components may have the same composition. For example, metal layer 39 may have the same composition as interconnects and bond pads 36; or, the source and drain electrodes may have the same composition. However, it should be understood that in other embodiments, the metal components may have different compositions.

In certain preferred embodiments, substrate 20 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used, though single crystal silicon substrates are preferred. In some cases, silicon (111) substrates are preferred. In other cases, silicon (100) substrates are preferred. In some embodiments, silicon substrates having a relatively high resistivity are preferred. For example, in some cases, the silicon substrate has a resistivity of greater than 10 kilo-Ohms.

It should be understood that other types of substrates may also be used including sapphire, silicon carbide, indium phosphide, silicon germanium, gallium arsenide, gallium nitride, aluminum nitride, or other III-V compound substrates. However, in embodiments that do not use silicon substrates, all of the advantages associated with silicon substrates may not be achieved. In some embodiments, it may be preferable to use non-nitride material-based substrates such as silicon, sapphire, silicon carbide, indium phosphide, silicon germanium and gallium arsenide.

Substrate 20 may have any suitable dimensions. Suitable diameters include, but are not limited to, about 2 inches (or 50 mm), 4 inches (or 100 mm), 6 inches (or 150 mm), and 8 inches (or 200 mm). In some embodiments, it may be preferable to use a silicon substrate having relatively large diameters of at least about 4 inches (or 100 mm) or at least about 6 inches (or 150 mm). As described further below, the arrangement of layers between the silicon substrate and the gallium nitride material region (e.g., strain-absorbing layer 40, intermediate layer 42, and transition layer 21) may be designed to enable high quality gallium nitride material to be deposited even at relatively large diameters. In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, in thinner substrates. In other embodiments, thinner substrates (e.g., less than 125 microns) are used, though these embodiments may not have the advantages associated with thicker substrates, but can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). As shown, the layers/regions of the device (e.g., strain-absorbing layer, intermediate layer, transition layer, gallium nitride material region) may also be substantially planar in the final device or structure. As described further below, such layers/regions may be grown in vertical (e.g., non-lateral) growth processes. Planar substrates and layers/regions can be advantageous in some embodiments, for example, to simplify processing. Though it should be understood that, in some embodiments of the invention, lateral growth processes may be used, as described further below, which may use textured substrates.

The device structure may include one or more layers between substrate 20 (e.g., a silicon substrate) and the gallium nitride material region 18 which may promote formation of high quality gallium nitride material. As shown in FIG. 1A, the layer arrangement may include a strain-absorbing layer 40, an intermediate layer 42, and a transition layer 21. Suitable layer arrangements have been described in, for example, U.S. Patent Application Publication No. 2005-0285142 which is incorporated by reference and is based on commonly-owned U.S. patent application Ser. No. 11/096,505, filed Apr. 1, 2005. However, it should be understood that not all embodiments may include such layers.

In certain preferred embodiments, strain-absorbing layer 40 is formed of a silicon nitride-based material. Silicon nitride-based materials include any silicon nitride-based compound (e.g., $Si_xN_y$, such as SiN and $Si_3N_4$, SiCN, amongst others) including non-stoichiometric silicon nitride-based compounds. In some embodiments, a SiN strain-absorbing layer may be preferred. Silicon nitride material-based strain-absorbing layers may be particularly preferred when formed directly on a silicon substrate, as described further below.

The structure of FIG. 1 includes an intermediate layer 42 formed of a nitride-based material that overlies the strain-absorbing layer. Suitable nitride-based materials include, but are not limited to, aluminum nitride materials (e.g., aluminum nitride, aluminum nitride alloys) and gallium nitride materials (e.g., gallium nitride, gallium nitride alloys). In some cases, the intermediate layer has a constant composition.

In the illustrative embodiment, transition layer 21 is formed directly on the intermediate layer. In certain embodiments, such as when the intermediate layer has a constant composition, it may be preferred for the transition layer to be formed of a compositionally-graded material (e.g., a compositionally-graded nitride-based material). Suitable compositionally-graded layers have been described in commonly-owned U.S. Pat. No. 6,649,287 which is incorporated herein by reference. According to one set of embodiments, the transition layer is compositionally-graded and formed of an alloy of gallium nitride such as $Al_xIn_yGa_{(1-x-y)}N$, $Al_xGa_{(1-x)}N$, and $In_yGa_{(1-y)}N$. In these embodiments, the concentration of at least one of the elements (e.g., Ga, Al, In) of the alloy is varied across at least a portion of the thickness of the transition layer. When transition layer 21 has an $Al_xIn_yGa_{(1-x-y)}N$ composition, x and/or y may be varied. When the transition layer has a $Al_xGa_{(1-x)}N$ composition, x may be varied. When the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within gallium nitride material region 18. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In one preferred embodiment, device 10 includes an aluminum nitride intermediate layer 42 and a compositionally-graded transition layer 21. The compositionally-graded transition layer may have a composition of $Al_xGa_{(1-x)}N$, where x is graded from a value of 1 at the back surface of the transition layer to a value of 0 at the front surface of the transition layer. The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

Active regions of the device may be formed in gallium nitride material region 18. Gallium nitride material region 18 comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in U.S. Pat. No. 6,649,287, incorporated by reference above.

In some cases, the gallium nitride material region includes only one gallium nitride material layer. In other cases, the gallium nitride material region includes more than one gallium nitride material layer. For example, the gallium nitride material region may include multiple layers. In certain embodiments, it may be preferable for the gallium nitride material of a first layer to have an aluminum concentration that is greater than the aluminum concentration of the gallium nitride material of a second layer of region 18. For example, the value of x in the gallium nitride material of first layer (with reference to any of the gallium nitride materials described above) may have a value that is between 0.05 and 1.0 greater than the value of x in the gallium nitride material of second layer, or between 0.05 and 0.5 greater than the value of x in the gallium nitride material of the first layer. For example, the second layer may be formed of $Al_{0.26}Ga_{0.74}N$, while the first layer is formed of GaN. This difference in aluminum concentration may lead to formation of a highly conductive region at the interface of the layers (i.e., a 2-D electron gas region). A third layer, for example, may be formed of GaN.

The semiconductor device structure illustrated in FIG. 1 may be incorporated into a variety of semiconductor devices including devices described in commonly-owned U.S. Pat. No. 7,071,498 which is incorporated herein by reference and is based on commonly-owned, co-pending U.S. patent application Ser. No. 10/740,376, filed on Dec. 17, 2003, and entitled "Gallium Nitride Material Devices Including an Electrode-Defining Layer and Methods of Forming the Same". Suitable devices include, but are not limited to, electronic devices including transistors (e.g., FETs), SAW devices, and sensors; as well as, light-emitting devices including LEDs and laser diodes. The devices have active regions that are typically, at least in part, within the gallium nitride material region. Also, the devices include a variety of other functional layers and/or features (e.g., electrodes).

Figure 2:
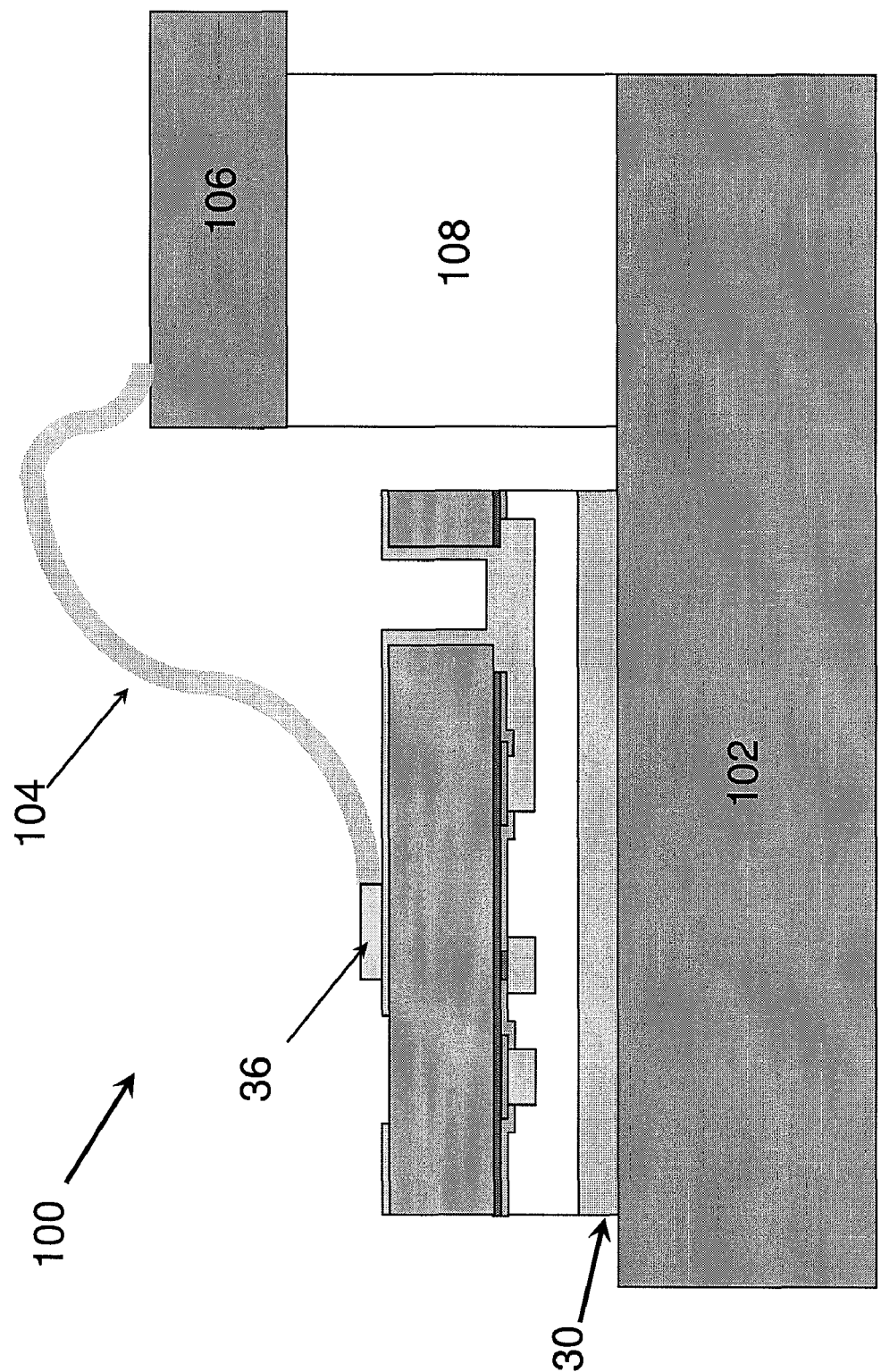
FIG. 2 illustrates a packaged gallium nitride material-based device structure according to another embodiment of the present invention.

FIG. 2 illustrates a gallium nitride material device structure 100 according to an embodiment of the invention. In FIG. 2, the device structure shown in FIG. 1 has been flipped such that the topside is now facing downward. The thermally conductive layer 30 is bonded to a support 102. The support comprises a thermally conductive material that can act as a heat sink for the system. A bond wire 104 connects the electrically conductive bond pad 36 to a lead 106. The lead is electrically insulated from the support 102 by an insulator 108. In some embodiments, support 102, lead 106 and insulator 108 are portions of a device package.

It should be understood that not all of the features (e.g., layers) shown in FIG. 2 are present in all embodiments of the invention and that the illustrated features may be otherwise positioned within the structure. For example, certain embodiments may include a support which functions as a heat sink but may not have the bond wire/lead arrangement shown in FIG. 2. Also, additional features may be present in other embodiments.

Support 102 may be comprised of any material with a suitable thermal conductivity. Suitable materials include metals (e.g., copper) and metal alloys (e.g., copper-based alloys).

Insulator 108 may be formed of any material having sufficient insulating properties such as ceramic materials.

In the illustrative embodiment, the thermally conductive layer 30 is used to attach the device structure shown in FIG. 1 to the support. Any suitable material may be used including AuSi.

In general, known processing techniques may be used to process the device structures described herein. For example, the diamond region may be formed in a CVD process. Other layers may also be formed by suitable deposition techniques. Vias may be formed using conventional etching techniques. Suitable processes have been described in commonly-owned U.S. Pat. No. 7,071,498; U.S. Pat. No. 6,649,287; and, U.S. Patent Application Publication No. 2005-0285142 which are incorporated by reference above.

Figure 3C:
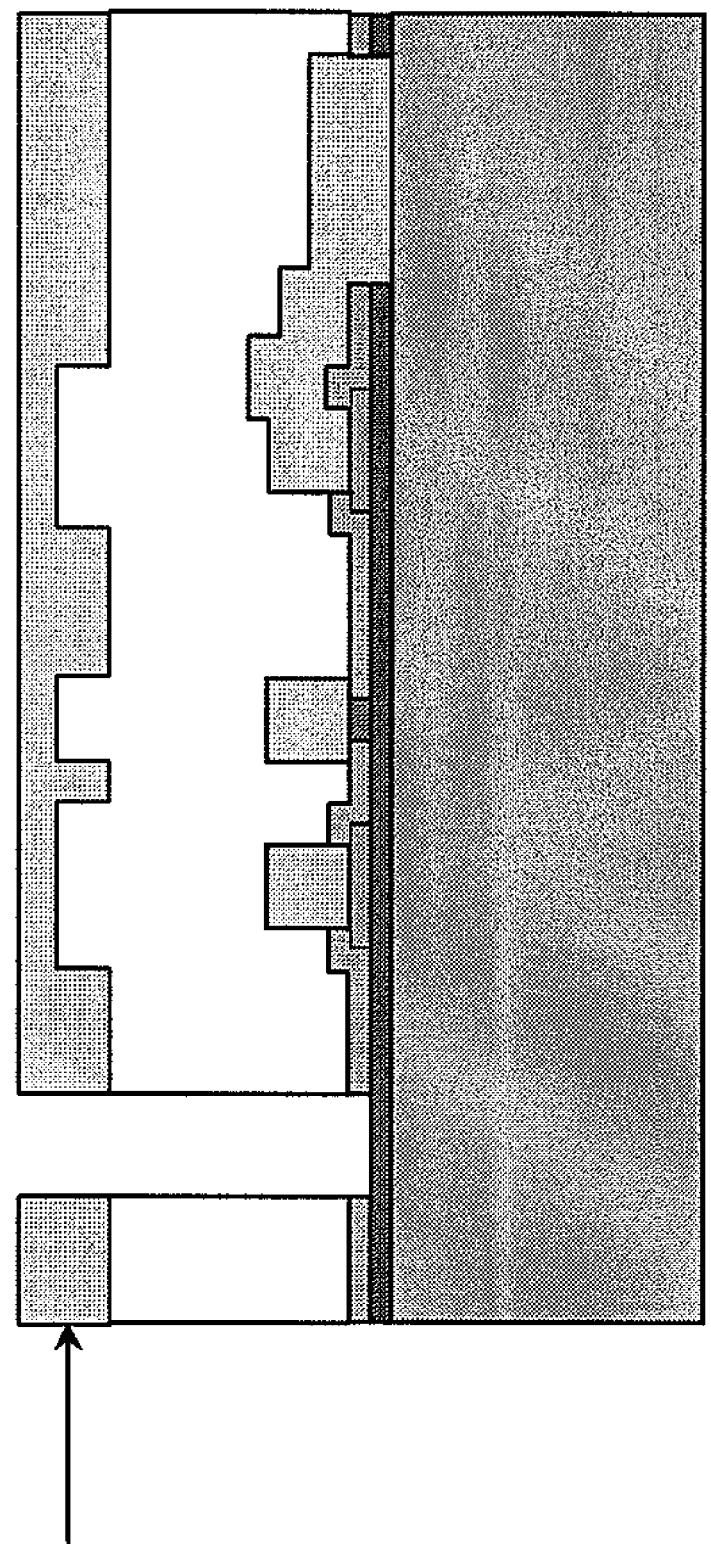
Figure 3D:
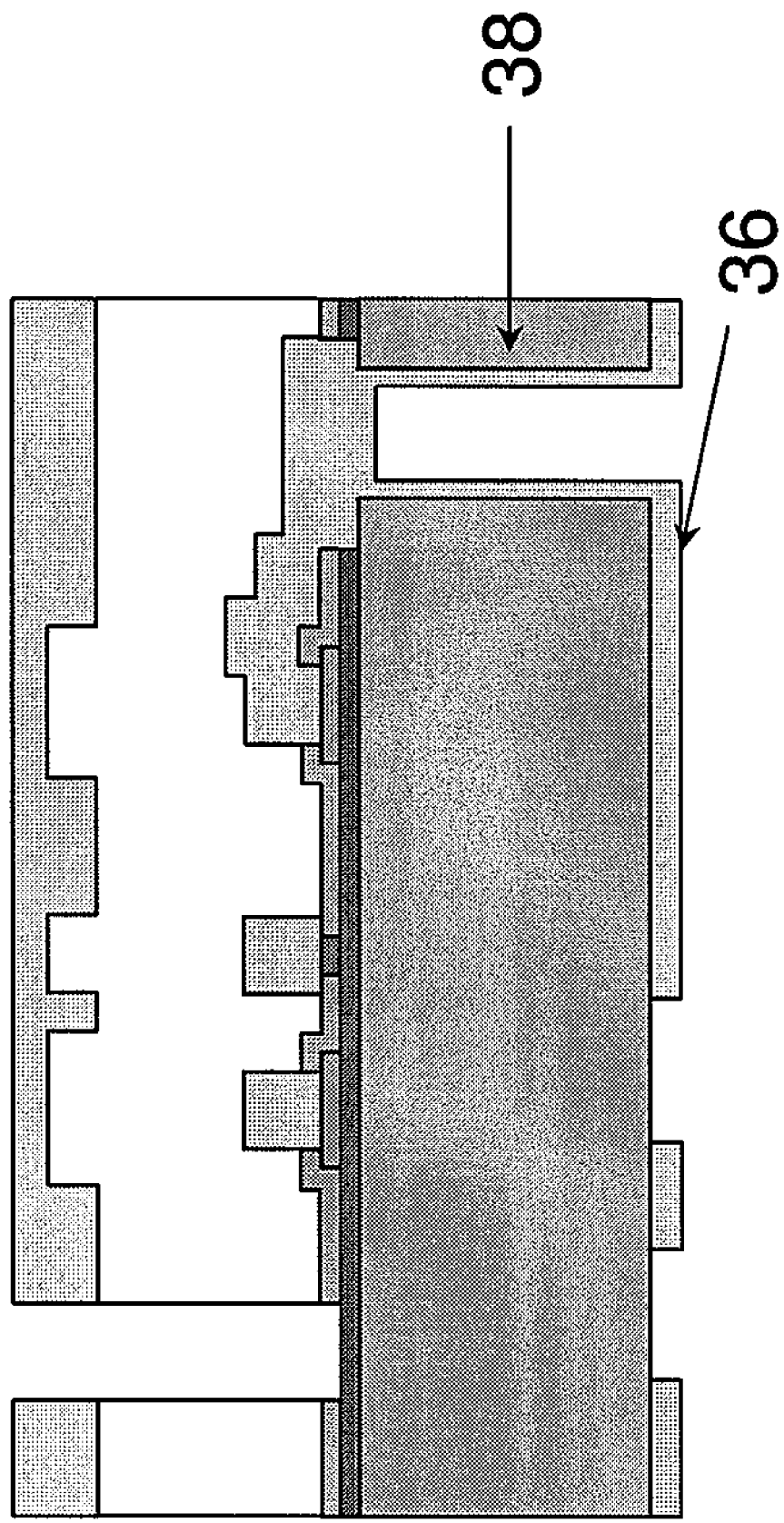
Figure 3E:
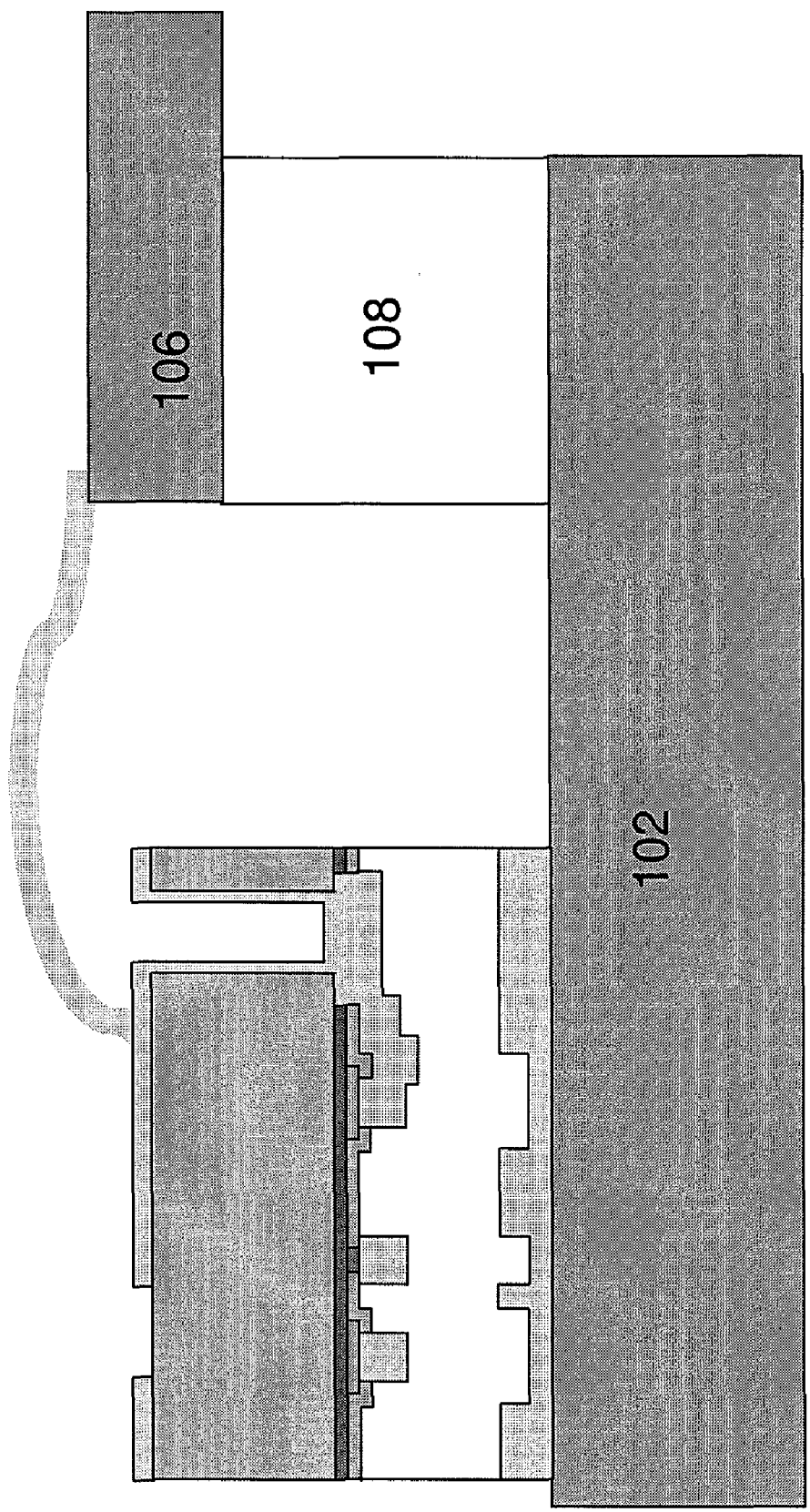

FIGS. 3A-E illustrate a series of device structure cross-sections at different times during processing of the device structure 100 shown in FIG. 2 according to one embodiment of the invention. FIG. 3A depicts a device cross-section after gallium nitride material region 18 is formed on substrate 20 and nucleation layer 22 is formed on the gallium nitride material region, amongst other steps. FIG. 3B illustrates the a device cross-section after etching the nucleation layer to expose gallium nitride material, forming electrodes, forming diamond region 26, and depositing a plug material 110 (e.g., photoresist) in a channel. FIG. 3C shows a device cross-section after deposition of thermally conductive layer 30 and removal of the plug material, after a polishing step. FIG. 3D shows a device cross-section after via 38 has been formed by a backside etch through the substrate. In addition, a backside metallization layer has been deposited to form interconnects, bond pads 36, and bond pad traces. FIG. 3E depicts a cross-section of the device structure after the device structure has been flipped and bonded to a package including support 102, lead 106 and insulator 108.

It should be understood that the process shown in FIGS. 3A-3E is merely an example of one process that may be used to form the device structure shown in FIG. 2. Variations to this process are possible as well as other processing techniques.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A gallium nitride material device structure comprising:
   a gallium nitride material region;
   a plurality of electrical contacts associated with the gallium nitride material region;
   a diamond region formed over the plurality of electrical contacts and formed on at least one of the plurality of electrical contacts, wherein the plurality of electrical contacts include a source electrode, gate electrode and drain electrode, and the diamond region is formed on the source electrode, gate electrode and drain electrode, and wherein the diamond region is formed directly on the source electrode, gate electrode and drain electrode.

2. A gallium nitride material device structure comprising:
   a gallium nitride material region;
   a nucleation layer formed over the gallium nitride material region, the nucleation layer having a window defined therein exposing a portion of the gallium nitride material region;
   a diamond region formed on the nucleation layer, wherein the gallium nitride material region in the window is substantially free of diamond being formed thereon, and wherein the nucleation layer enables formation of the diamond region thereon, wherein the device includes a source electrode, gate electrode and drain electrode, and the diamond region is formed over the source electrode, gate electrode and drain electrode, and wherein the diamond region is formed directly on source electrode, gate electrode and drain electrode.

3. A gallium nitride material device structure comprising:
   a gallium nitride material region;
   an electrical contact associated with the gallium nitride material region;
   a heat sink;
   a diamond region formed on the electrical contact, the diamond region arranged to conduct heat generated within the gallium nitride material region to the heat sink, wherein an electrically conductive pathway extends through the thickness of the gallium nitride material region, wherein the device includes a plurality of electrical contacts including a source electrode, gate electrode and drain electrode, and the diamond region is formed on the source electrode, gate electrode and drain electrode, and wherein the diamond region is formed directly on source electrode, gate electrode and drain electrode.

* * * * *